United States Patent
Kamiya

(10) Patent No.: US 6,188,245 B1
(45) Date of Patent: Feb. 13, 2001

(54) BUS CIRCUIT WHICH PREVENTS CURRENT FROM FLOWING FROM A POWER SUPPLY OF ONE CIRCUIT TO A POWER SUPPLY OF ANOTHER CIRCUIT FOR A PREDETERMINED PERIOD

(75) Inventor: Hiroshi Kamiya, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/306,387

(22) Filed: May 6, 1999

(30) Foreign Application Priority Data

May 6, 1998 (JP) .................................. 10-123164

(51) Int. Cl.⁷ ........................................... H03K 19/0175
(52) U.S. Cl. ................................. 326/86; 326/21
(58) Field of Search .................. 326/21, 86, 81; 327/333

(56) References Cited

U.S. PATENT DOCUMENTS

| 5,338,978 | 8/1994 | Larsen et al. ................. 307/443 |
| 5,408,146 | * 4/1995 | Nguyen et al. ................. 326/86 |
| 5,530,392 | * 6/1996 | Runas et al. ................. 327/333 |
| 5,585,744 | * 12/1996 | Runas et al. ................. 326/86 |
| 5,818,260 | * 10/1998 | Kuo ................. 326/86 |

FOREIGN PATENT DOCUMENTS

H3-35615 2/1991 (JP) .
H3-85040 4/1991 (JP) .
H9-6476 1/1997 (JP) .

\* cited by examiner

Primary Examiner—David Nelms
Assistant Examiner—Thong Le
(74) Attorney, Agent, or Firm—Sughrue, Mion, Zinn, Macpeak & Seas, PLLC

(57) ABSTRACT

A bus circuit of the present invention includes a first circuit connected to a first power supply, a second circuit connected to a second power supply, a transmission line which connects the first and second circuits and a third circuit. The third circuit prevents current from flowing between the first and second power supplies through the transmission line for a predetermined period after the first power supply is applied. Another bus circuit of the present invention includes a transmission line, a first circuit which is connected to a first power supply and outputs a signal to the transmission line, a second circuit which is connected to a second power supply and receives the signal output by the first circuit through the transmission line, and a third circuit which is provided between the transmission line and the first circuit and which prevents the signal from transmitting from the first circuit to the transmission line for a predetermined period after the first power supply is applied. Yet another bus circuit of the present invention includes a transmission line, an first circuit includes an output terminal connected to the transmission line and a path which is formed between a first power supply and the output terminal and is used for outputting a high-level logic signal to the transmission line, wherein the output circuit prevents current from flowing on the path for a predetermined period after the first power supply is applied; and a second circuit connected to a second power supply and connected to the output terminal of the first circuit through the transmission line.

18 Claims, 8 Drawing Sheets

BUS CIRCUIT WHICH PREVENTS CURRENT FROM FLOWING FROM A POWER SUPPLY OF ONE CIRCUIT TO A POWER SUPPLY OF ANOTHER CIRCUIT FOR A PREDETERMINED PERIOD

BACKGROUND OF THE INVENTION

The present invention relates to a bus circuit, and more specifically, to a bus circuit which connects a first device and a second device through a transmission line.

In a conventional bus circuit of this type, an output device is connected to a receive device through a transmission line that transmits a signal.

Referring to FIG. 8, a conventional bus circuit includes an output buffer 1110 provided in an output device 1100, a receiver 1210 provided in a receive device 1200 and a transmission line 1300 which connects output buffer 1110 and receiver 1210.

In output buffer 1110, an output terminal 1112 is connected to transmission line 1300. Output buffer 1110 outputs a high logic level signal to transmission line 1300 by forming a current path between a power supply $V_{DD}$ and output terminal 1112. Output buffer 1110 is a complimentary metal oxide semiconductor (CMOS) inverter. Output buffer 1110 includes a positive channel metal oxide semiconductor (PMOS) transistor 1113 and a negative channel metal oxide semiconductor (NMOS) transistor 1114. PMOS transistor 1113 has a gate terminal to which an input signal is applied and is connected between power supply $V_{DD}$ and transmission line 1300. NMOS transistor 1114 has a gate terminal to which an input signal is applied and is connected between a ground potential GND and transmission line 1300.

In the receive device 1200, the input terminal of receiver 1210 is connected to transmission line 1300. A diode 1220 is provided between the input terminal of receiver 1210 and a power supply $V_{dd}$. Diode 1220 is used for producing a proper waveform of a signal received through transmission line 1300 (hereinafter referred to as first conventional art).

On the other hand, U.S. Pat. No. 5,338,978 discloses a bus circuit in which an output buffer circuit, coupled to a low potential power supply, is connected to an output buffer circuit, coupled to a high potential power supply device, through a transmission line. When the output buffer circuit coupled to the low potential power supply is inactive, a high potential signal may appear on the transmission line driven by the output buffer circuit coupled to the high potential power supply. The bus circuit keeps a pull-up output transistor off. This prevents a current from flowing to the low potential power supply through a pull-up transistor (hereinafter referred to as second conventional art).

In the first conventional art, when power supply $V_{DD}$ of output device 1100 is applied and power supply $V_{dd}$ of receive device 1200 is not applied, and when PMOS transistor 1113 of output buffer 1110 is on, current flows from power supply $V_{DD}$ of output device 1100 to power supply $V_{dd}$ of receive device 1200. This creates a problem because receiver 1210 and diode 1220 can be destroyed if an excessive current flows.

Meanwhile, the second conventional art only addresses a problem appearing when the power supply to the buffer circuit is turned off. This causes a problem because current flowing through the buffer circuit to another device cannot be cut off when power supply is applied to the buffer circuit.

SUMMARY OF THE INVENTION

An object of the present invention is to provide a bus circuit which prevents current from flowing from a power supply of an output device to a power supply of a receive device.

According to one aspect of the present invention, a bus circuit is provided which includes: a first circuit connected to a first power supply; a second circuit connected to a second power supply; a transmission line which connects the first and second circuits; and a third circuit which prevents current from flowing between the first and second power supplies through the transmission line for a predetermined period after the first power supply is applied to the first circuit.

According to another aspect of the present invention, a bus circuit is provided which includes: a transmission line; a first circuit which is connected to a first power supply and outputs a signal to the transmission line; a second circuit which is connected to a second power supply and receives the signal output by the first circuit through the transmission line; and a third circuit which is provided between the o transmission line and the first circuit and which prevents the signal from transmitting from the first circuit to the transmission line for a predetermined period after the first power supply is applied to the first circuit.

According to another aspect of the present invention, a bus circuit is provided which includes: a transmission line; an first circuit comprising an output terminal connected to the transmission line and a path which is formed between a first power supply and the output terminal and is used for outputting a high logic level signal to the transmission line, wherein the output circuit prevents current from flowing on the path for a predetermined period after the first power supply is applied to the first circuit; and a second circuit connected to a second power supply and connected to the output terminal of the first circuit through the transmission line.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
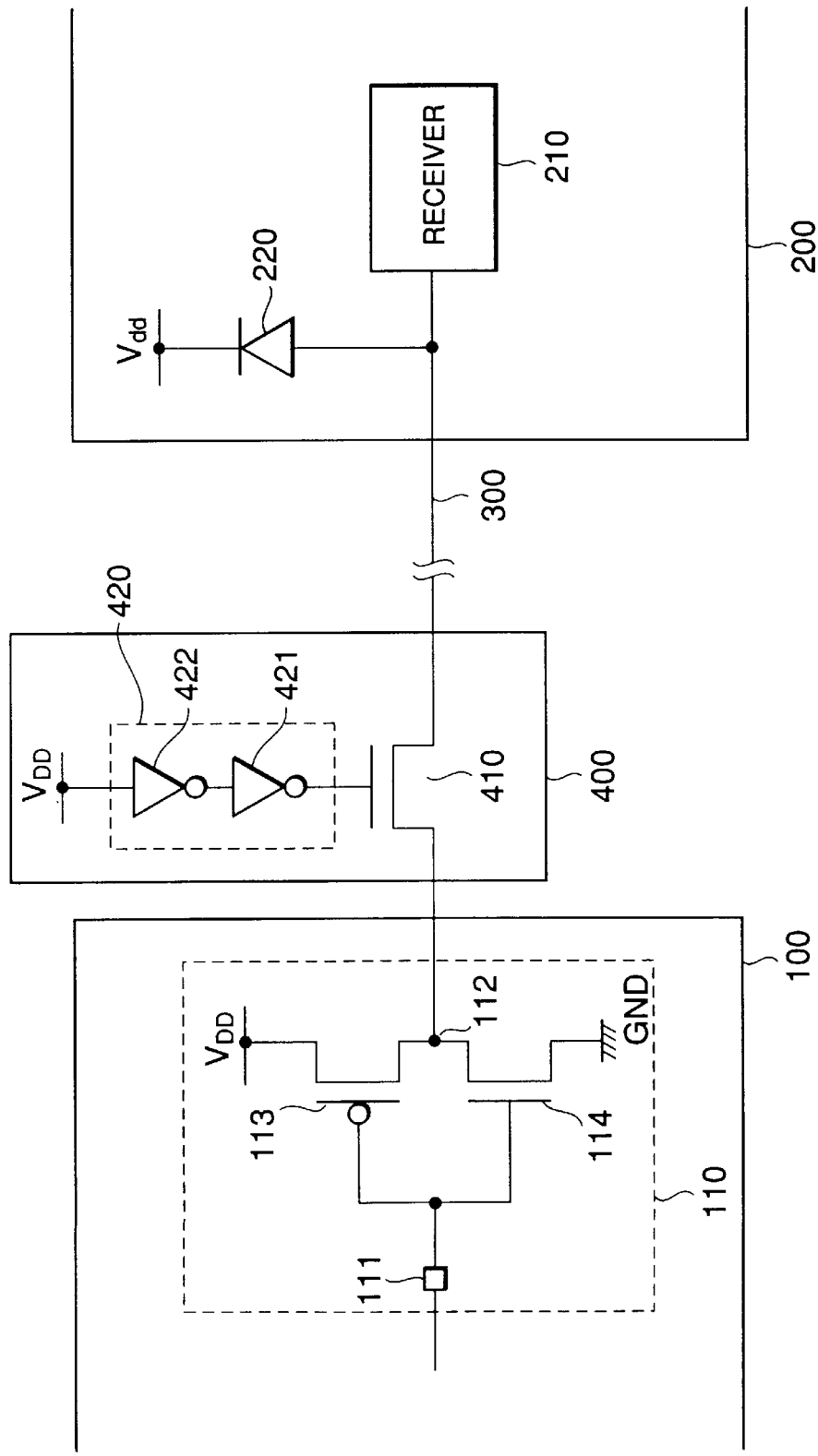
FIG. 1 is a circuit of the first embodiment of the present invention.

In FIG. 1, a bus circuit includes an output device 100, a receive device 200, a transmission line 300, and a cutoff circuit 400. The output from output device 100 is connected to the input of receive device 200 through cutoff circuit 400 and transmission line 300.

Output device 100 includes an output buffer 110. Output device 100 is, for example, a large scale integrated circuit (LSI). Output device 100 includes a power Supply $V_{DD}$.

Output buffer 110 has an input terminal 111 and an output terminal 112. A signal, which has a high or low logic level that is to be output to transmission line 300, is applied to input terminal 111. Output terminal 112 is connected to transmission line 300 through cutoff circuit 400. In this embodiment, output buffer 110 is a CMOS inverter, and comprises a positive channel metal oxide semiconductor (PMOS) PMOS transistor 113 and a negative channel metal oxide semiconductor (NMOS) NMOS transistor 114.

PMOS transistor 113 includes a gate terminal. Input terminal 111 is connected to the gate terminal. PMOS transistor 113 is connected between power supply terminal $V_{DD}$ and output terminal 112. In this embodiment, the potential of power supply terminal $V_{DD}$ is 3.3 V.

NMOS transistor 114 includes a gate terminal. The gate terminal is connected to input terminal 111. NMOS transistor 114 is connected between output terminal 112 and ground terminal GND. NMOS transistor 114 may be connected between a power supply terminal having a potential lower than the potential of power supply terminal $V_{DD}$, instead of ground terminal GND, and output terminal 112.

Receive device 200 has a receiver circuit 210 and a diode 220. Receive device 200 is, for example, an LSI. Receive device 200 includes a power supply $V_{dd}$. In this embodiment, the potential of power supply terminal $V_{dd}$ is 2.5 V.

Receiver circuit 210 includes an input terminal. The input terminal is connected to transmission line 300. Receiver circuit 210 receives an output signal transmitted from output device 100 through transmission line 300. Receiver circuit 210 is connected to power supply $V_{dd}$.

Diode 220 is connected between transmission line 300 and power supply $V_{dd}$. An anode of diode 220 is connected to transmission line 300 and the input terminal of receiver circuit 210. A cathode of diode 220 is connected to power supply $V_{dd}$. Diode 220 forms a current path between transmission line 300 and power supply $V_{dd}$ to prevent current, which flows through transmission line 300, from overshooting when the potential of the signal input to the receiver 210 exceeds the potential obtained by adding the potential of the power supply terminal $V_{dd}$ and the forward voltage of diode 220. The forward voltage of diode 220 is, for example, 0.4 V.

Cut-off circuit 400 has an NMOS transistor 410 and a delay circuit 420. Cut-off circuit 400 is provided close to, but outside, output device 100.

NMOS transistor 410 includes a gate terminal connected to delay circuit 420, and is connected between output terminal 112 of output buffer 110 of output device 100 and transmission line 300. NMOS transistor 410 may be a transfer gate.

Delay circuit 420 has a first terminal connected to power supply $V_{DD}$ and a second terminal connected to the gate terminal of NMOS transistor 410. Delay circuit 420 inputs a potential of power supply $V_{DD}$ applied to the first terminal and outputs the potential of power supply $V_{DD}$ to NMOS transistor 410 from the second terminal. Delay circuit 420 delays outputting the potential of power supply $V_{DD}$ to NMOS transistor 410 for a predetermined period. The predetermined period is the delay time of delay circuit 420, and is set to a time between the time when power supply $V_{DD}$ is applied to output buffer 110 and the time when power supply $V_{dd}$ is applied to diode 220. Preferably, the predetermined period is obtained by subtracting a signal propagation time from power supply $V_{DD}$ connected to PMOS transistor 113 to power supply $V_{dd}$ connected to diode 220 from a time period between the time when power supply $V_{DD}$ is applied to output device 100 and the time when power supply $V_{dd}$ is applied to receive device 200. Specifically, assuming that the time when power supply $V_{dd}$ is applied to receive device 200 is Trec, the time when power supply $V_{DD}$ is applied to output device 100 is Tsend, the switching time of NMOS transistor 410 is Ts, the delay time of the transmission line is Td, and the propagation time of diode 220 is Ttrans, it is preferable to set the predetermined period to a value equal to or greater than (Trec-Tsend-Ts-Td-Ttrans). In this embodiment, delay circuit 402 has two inverters, 421 and 422, connected at two stages.

Next, the operation of this embodiment will be described.

When power supply $V_{DD}$ is applied to output device 100, the potential at power supply $V_{DD}$ rises to 3.3 V. On the other hand, the potential at power supply $V_{dd}$ has not yet risen to 2.5 V because power has not yet been applied to power supply $V_{dd}$ or even if power has already been applied, the potential at power supply $V_{dd}$ reaches 2.5 V later than the potential at $V_{dd}$ reaches 3.3 V.

In output device 100, the output signal applied to input terminal 111 of the output buffer 110 is in an unstable state from the time when power supply $V_{DD}$ is applied until an initialization is performed. When the signal applied to input terminal 111 is at a low logic level, PMOS transistor 113 is on, and a current path is formed between power supply $V_{DD}$ and output terminal 112 of the output buffer 110.

Power supply $V_{DD}$ is also applied to the first terminal of delay circuit 420 of cutoff circuit 400. Delay circuit 420 outputs a low logic level potential to the second terminal for a predetermined period after power supply $V_{DD}$ is applied to the first terminal. Since the low logic level potential is input to the gate terminal of NMOS transistor 410, NMOS transistor 410 does not turn on. Therefore, cutoff circuit 400 prevents current from flowing from power supply $V_{DD}$ in output device 100 to transmission line 300 through output buffer 110. Thus, cutoff circuit 400 prevents a current path from being formed between output terminal 112 and transmission line 300.

After the predetermined period, the delay time of delay circuit 420, has elapsed, delay circuit 420 outputs a high logic level potential of 3.3 V from the second terminal of delay circuit 420. Since a high logic level potential is applied to the gate terminal of NMOS transistor 410, NMOS transistor 410 turns from off to on. The current flowing from power supply $V_{DD}$ in output device 100 through output buffer 110 is transmitted to transmission line 300 through NMOS transistor 410.

When the delay time of delay circuit 420 is set to a time between the time when power supply $V_{DD}$ is applied to output device 100 and the time when power supply $V_{dd}$ is applied to receive device 200, power supply $V_{dd}$ has already been applied to receive device 200 when the current from power supply $V_{DD}$ of output device 100 is transmitted to transmission line 300 through NMOS transistor 410. Therefore, the potential at receiving device 200 rises to the 2.5 V potential of power supply $V_{dd}$, and the current may flow from power supply $V_{DD}$ in output device 100 to power supply $V_{dd}$ of receive device 200 through diode 220 only when the potential applied to the anode terminal of diode 220 exceeds the potential which is obtained by adding the potential of the power supply $V_{dd}$ and the forward voltage of diode 220.

As described above, in the present embodiment, cutoff circuit 400 is provided in transmission line 300 which connects output device 100 and receive device 200. Cutoff circuit 400 transmits the output from output device 100 to the transmission line after a predetermined period has elapsed after the potential has risen at power supply $V_{DD}$ of output device 100. Therefore, a current path from power supply $V_{DD}$ of output device 100 to power supply $V_{dd}$ of receive device 200 can be cut off during the time after the potential rises at power supply $V_{DD}$ of the output device 100 to the time after the potential rises at power supply $V_{dd}$ of receive device 200.

Next, a second embodiment of the present invention will be described below.

A novel feature of the second embodiment is the configuration of the cutoff circuit. The other portions of the circuit are the same as those in the first embodiment.

Figure 2:
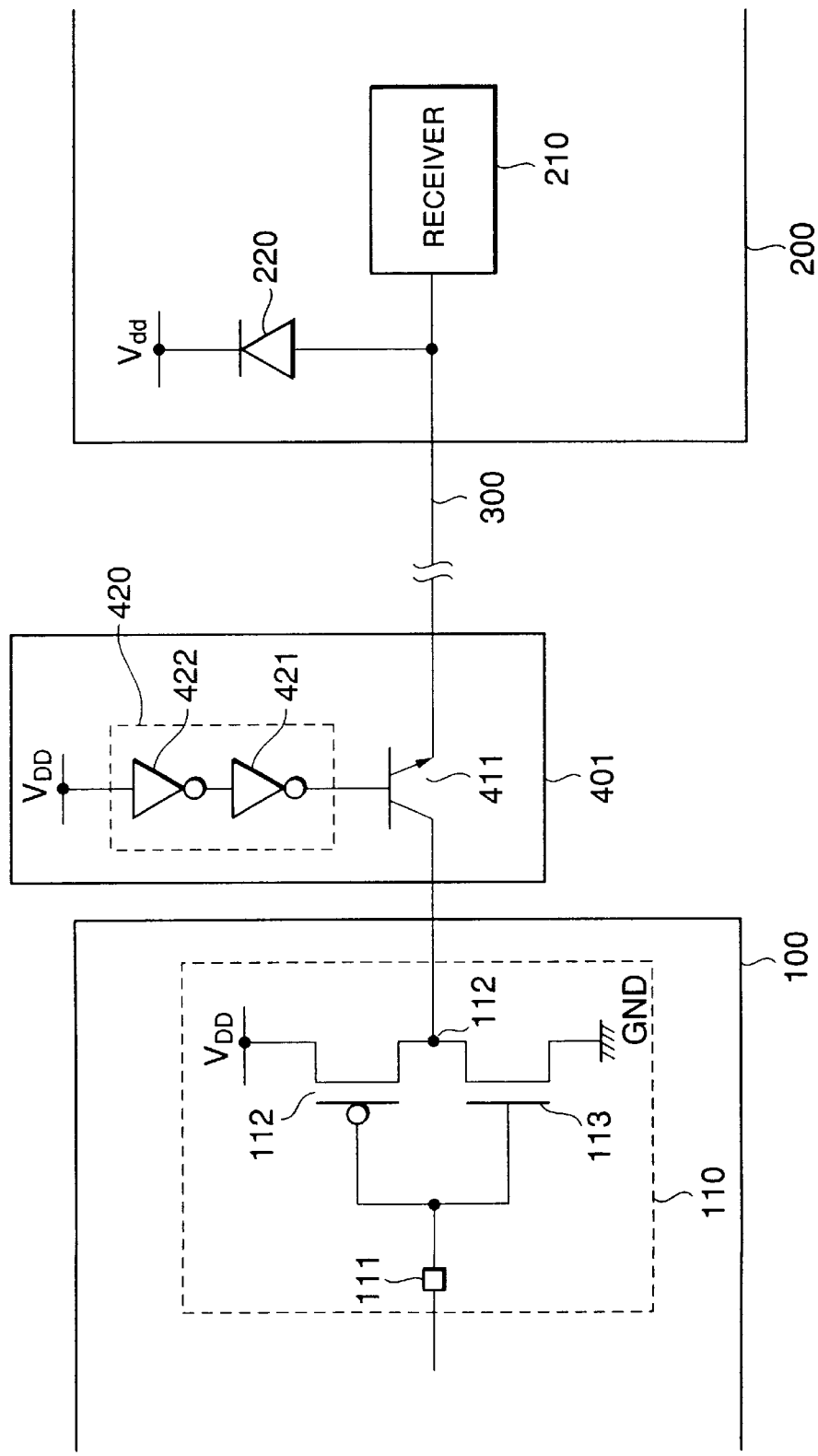
FIG. 2 is a circuit of the second embodiment of the present invention.

Referring to FIG. 2, a cutoff circuit 401 comprises an NPN transistor 411 and delay circuit 420. Delay circuit 420 has the same configuration as in the first embodiment.

The NPN transistor 411 has a gate terminal connected to delay circuit 420, and is connected between output terminal 112 of output buffer 110 and transmission line 300. NPN transistor 411 may be a transfer gate.

Next, a third embodiment of the present invention will be described below.

Figure 3:
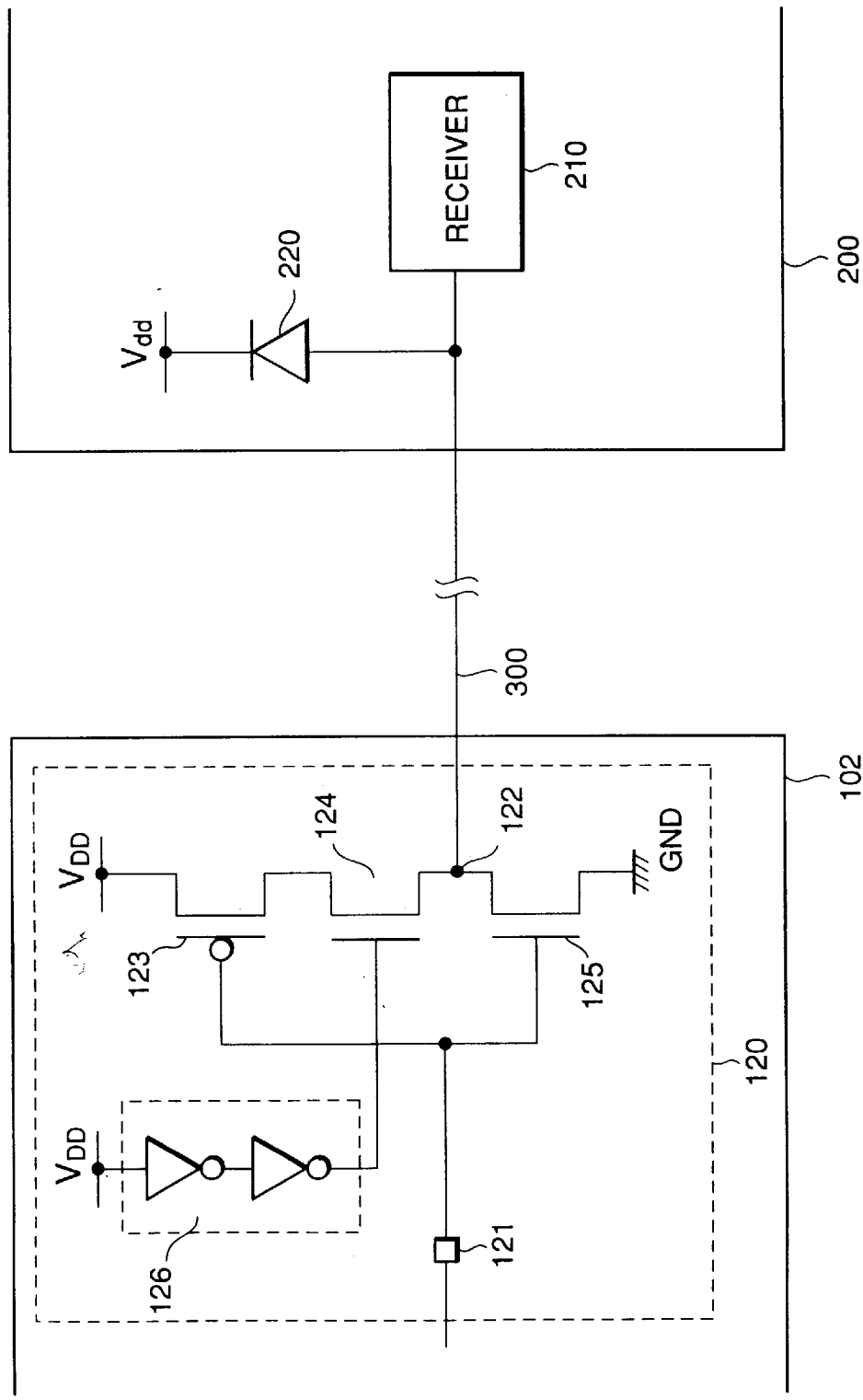
FIG. 3 is a circuit of the third embodiment of the present invention.

Referring to FIG. 3, a bus circuit includes an output device 102, receive device 200, and transmission line 300. The output from output device 102 is connected to the input of receive device 200 through transmission line 300. Receive device 200 has the same configuration as in the first embodiment.

Output device 102 includes an output buffer 120. Output device 102 is, for example, an LSI. Output device 102 includes a power supply $V_{DD}$.

Output buffer 120 includes an input terminal 121 and an output terminal 122. A signal, which has a high or low logic level and is output to transmission line 300, is applied to input terminal 121. Output terminal 122 of output buffer 120 is connected to transmission line 300. Output buffer 120 includes a PMOS transistor 123, an NMOS transistor 124, an NMOS transistor 125, and a delay circuit 126.

PMOS transistor 123 has a gate terminal which is connected to input terminal 121. PMOS transistor 123 is connected to output terminal 122 through NMOS transistor 124. That is, PMOS transistor 123 is connected between power supply $V_{DD}$ and NMOS transistor 124. In this embodiment, the potential of power supply $V_{DD}$ is 3.3 V.

NMOS transistor 124 has a gate terminal. The gate terminal is connected to the output terminal of delay circuit 126. NMOS transistor 124 is connected between PMOS transistor 123 and output terminal 122. NMOS transistor 124 forms a current path between PMOS transistor 123 and output terminal 122 based on a signal input to its gate terminal.

NMOS transistor 125 has a gate terminal. The gate terminal is connected to input terminal 121. NMOS transistor 125 is connected between output terminal 122 and ground terminal GND. NMOS transistor 125 can be connected between output terminal 122 and a power supply terminal having a potential lower than the potential of power supply $V_{DD}$.

Delay circuit 126 has an input terminal connected to power supply $V_{DD}$ and an output terminal connected to the gate terminal of NMOS transistor 124. Delay circuit 126 outputs the potential of power supply $V_{DD}$, which is applied to its input terminal, from its output terminal. Delay circuit 126 delays outputting the potential of power supply $V_{DD}$ to NMOS transistor 124 for a predetermined period. The predetermined period is the delay time of delay circuit 126, and is set to a time between the time when power supply $V_{DD}$ is applied to output device 102 and the time when power supply $V_{dd}$ is applied to receive device 102. Preferably, the predetermined period is obtained by subtracting the signal propagation time from power supply $V_{DD}$ connected to PMOS transistor to power supply $V_{dd}$ connected to diode 220 from a time period between the time when power supply $V_{DD}$ is applied to output device 102 and the time when power supply $V_{dd}$ is applied to receive device 102. Specifically, assuming that the time when power supply $V_{dd}$ is applied to receive device 200 is Trec, the time when power supply $V_{DD}$ is applied to output device 102 is Tsend, the switching time of the NMOS transistor 124 is Ts, the delay time of the transmission line is Td, and the propagation time of diode 220 is Ttrans, it is preferable to set the predetermined period to a value equal to or greater than (Trec-Tsend-Ts-Td-Ttrans). In this embodiment, delay circuit 126 has two inverters at two stages.

In this embodiment, a cutoff circuit, which cuts off a current path formed between power supply $V_{DD}$ and output terminal 122 in output buffer 120 for the predetermined time, is formed by NMOS transistor 124 and delay circuit 126.

Next, the operation of this embodiment will be described.

When power supply $V_{DD}$ is applied to output device 102, the potential at power supply $V_{DD}$ rises to 3.3 V. On the other hand, the potential at power supply $V_{dd}$ has not yet risen to 2.5 V because power has not yet been applied to power supply $V_{dd}$ or even if power has already been applied, the potential at power supply $V_{dd}$ reaches 2.5 V later than the potential at $V_{dd}$ reaches 3.3 V.

In output device 100, the output signal applied to input terminal 121 of output buffer 120 is in an unstable state from the time when the power supply $V_{DD}$ is applied until an initialization is performed. When the signal applied to input terminal 121 is at a low logic level, PMOS transistor 123 is on.

Power supply $V_{DD}$ of output device 102 is also applied to the input terminal of delay circuit 126. Delay circuit 126 outputs a low logic level potential from the output terminal for a predetermined period after power supply $V_{DD}$ is applied to its input terminal. Since the low logic level potential is input to the gate terminal of NMOS transistor 124, NMOS transistor 124 does not turn on. Therefore, a current path is not formed between power supply $V_{DD}$ and output terminal 122. Thus, a cutoff circuit formed by delay circuit 126 and NMOS transistor 124 prevents current from flowing from power supply $V_{DD}$ of output buffer 120 to transmission line 300 through output buffer 120.

When the predetermined period, the delay time of delay circuit 126, has elapsed, delay circuit 126 outputs the high logic level potential of 3.3 V from its output terminal. Since the high logic level potential is applied to the gate terminal of NMOS transistor 124, NMOS transistor 124 turns from off to on. If PMOS transistor 123 is on, a current path is formed from power supply $V_{DD}$ of output buffer 120 to output terminal 122 through PMOS transistor 123 and NMOS transistor 124.

When the delay time of delay circuit 126 is set to a time between the time when power supply $V_{DD}$ is applied to output device 102 and the time when power supply $V_{dd}$ is applied to receive device 200, power supply $V_{dd}$ has already been applied to receive device 200 when the current from power supply $V_{DD}$ of output buffer 120 is transmitted to transmission line 300 through PMOS transistor 123 and NMOS transistor 124. The current flows from power supply $V_{DD}$ of output buffer 120 to power supply $V_{dd}$ of receive device 200 through diode 220 only when the potential applied to the anode terminal of diode 220 exceeds the potential which is obtained by adding the potential of power supply $V_{dd}$ and the forward voltage of diode 220 because the potential at receive device 200 rises to the 2.5 V potential of power supply $V_{dd}$.

As described above, in this embodiment, output buffer 120, which transmits the output from output device 102 to transmission line 300 after the predetermined period has elapsed after the potential has risen at power supply $V_{DD}$ of output device 102, is provided in output device 102. Therefore, a current path from power supply $V_{DD}$ of output buffer 120 to power supply $V_{dd}$ of receive device 200 can be cut off between the time when power supply $V_{DD}$ is applied to output buffer 120 and the time when power supply $V_{dd}$ is applied to receive device 200.

In this embodiment, a cutoff circuit formed by delay circuit 126 and NMOS transistor 124 is designed as a part of output buffer 120. Therefore, the circuit of this embodiment can be smaller than a circuit of the first embodiment. Specifically, an output device 102 having a cutoff circuit can be inplemented by a single LSI when output device 102 is an LSI.

Next, a fourth embodiment of the present invention will be described in detail. A novel feature of the fourth embodiment is the configuration of the output buffer. The other portions of the circuit are the same as those in the third embodiment.

Figure 4:
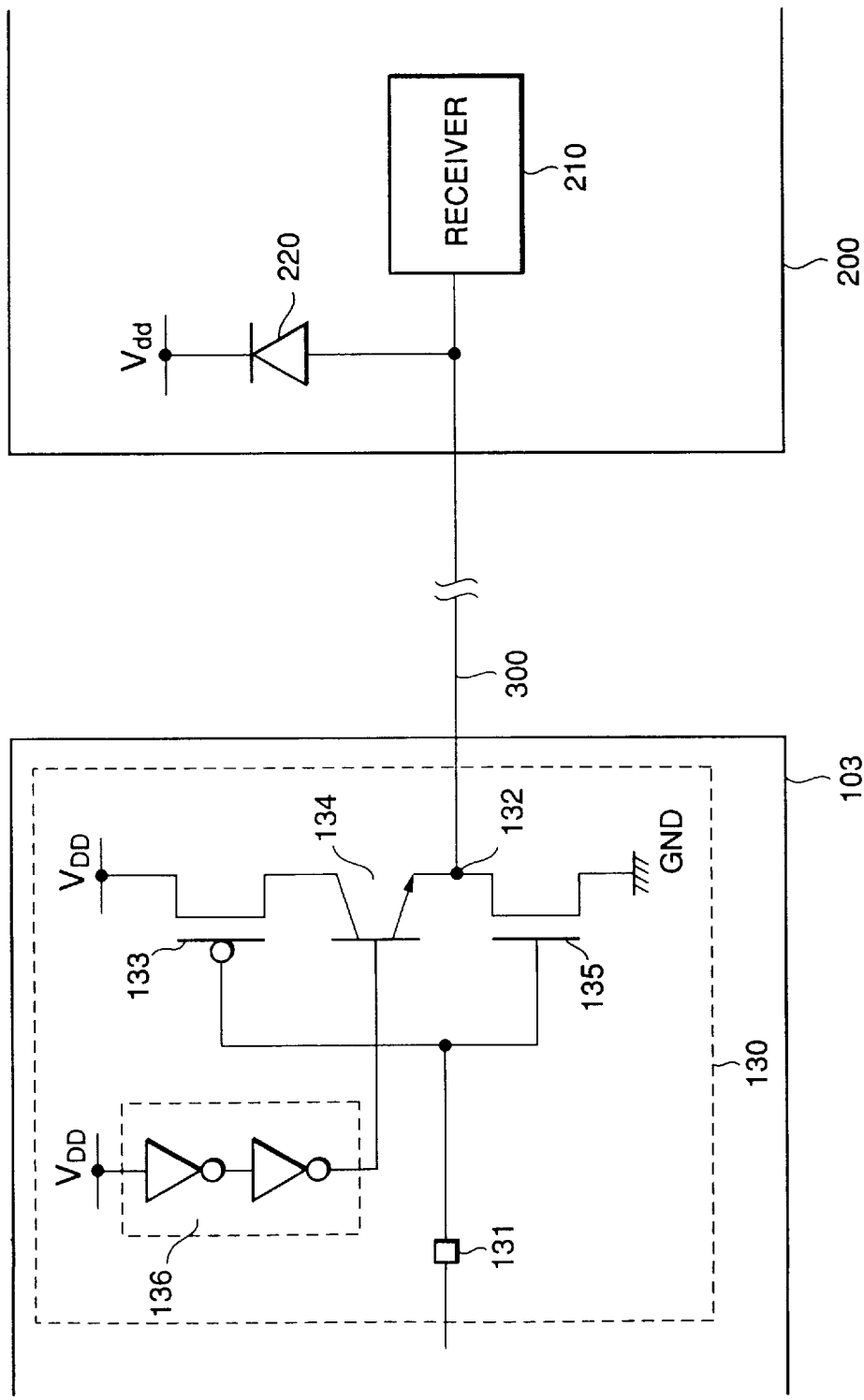
FIG. 4 is a circuit of the fourth embodiment of the present invention.

Referring to FIG. 4, an output device 103 includes an output buffer 130. Output buffer 130 has an input terminal 131 and an output terminal 132. A signal, which has a high or low logic level and is output to transmission line 300, is applied to input terminal 131. Output terminal 132 of output buffer 130 is connected to transmission line 300. Output buffer 130 includes a PMOS transistor 133, an NPN transistor 134, an NMOS transistor 135, and a delay circuit 136. Each of the PMOS transistor 133, NMOS transistor 135, and delay circuit 136 has the same configuration as PMOS transistor 123, NMOS transistor 125, and delay circuit 126 in the third embodiment, respectively.

NPN transistor 134 has a base terminal. The base terminal is connected to the output terminal of delay circuit 136. NPN transistor 134 is connected between PMOS transistor 133 and output terminal 132. NPN transistor 134 forms a current path between PMOS transistor 133 and output terminal 122 based on a signal input to the gate terminal.

In this embodiment, output device 103 is produced by a bipolar CMOS process (BiCMOS process). Next, a fifth embodiment of the present invention will be described below in detail. A novel feature of the fifth embodiment is the configuration of the transistor connected between power supply $V_{DD}$ and the output terminal of the output buffer. The other portions of the circuit are the same as in the third embodiment.

Figure 5:
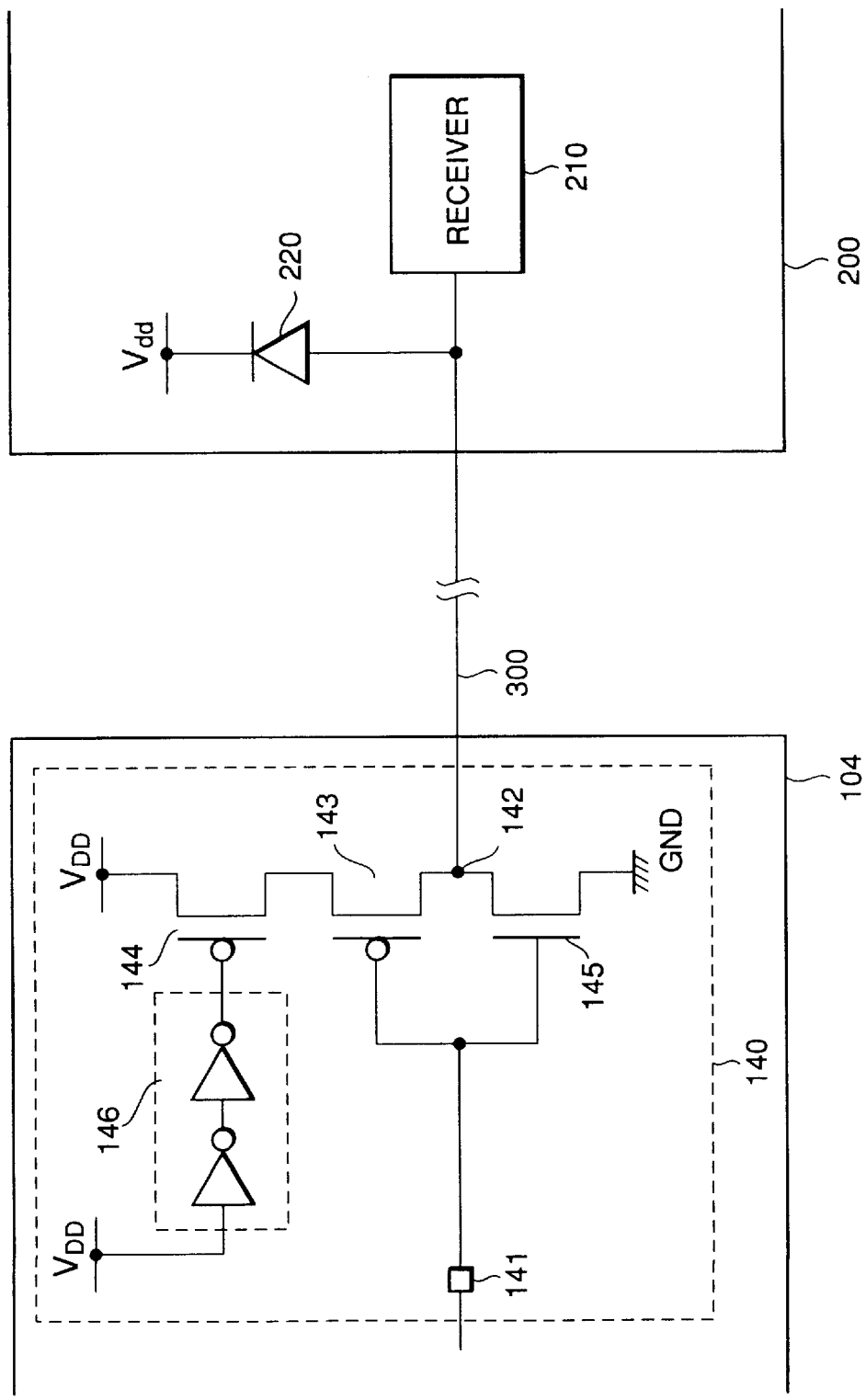
FIG. 5 is a circuit of the fifth embodiment of the present invention.

Referring to FIG. 5, an output device 104 includes an output buffer 140. Output device 104 is, for example, an LSI. Output device 104 includes a power supply $V_{DD}$.

Output buffer 140 has an input terminal 141 and an output terminal 142. A signal, which has a high or low logic level and is output to transmission line 300, is applied to input terminal 141. Output terminal 142 of output buffer 140 is connected to transmission line 300. Output buffer 140 includes a PMOS transistor 143, an NMOS transistor 144, an NMOS transistor 145, and a delay circuit 146.

PMOS transistor 143 has a gate terminal which is connected to input terminal 141. PMOS transistor 143 is connected between NMOS transistor 144 and output terminal 142.

NMOS transistor 144 has a gate terminal. The gate terminal is connected to the output terminal of delay circuit 146. NMOS transistor 144 is connected between power supply $V_{DD}$ and PMOS transistor 143. In this embodiment, the potential of power supply $V_{DD}$ is 3.3 V. NMOS transistor 144 forms a current path between PMOS transistor 143 and power supply $V_{DD}$ based on a signal input to its gate terminal.

NMOS transistor 145 and delay circuit 146 have the same configuration as NMOS transistor 125 and delay circuit 126 in the third embodiment, respectively.

Next, the operation of this embodiment will be described.

When power supply $V_{DD}$ is applied to output device 104, the potential at power supply $V_{DD}$ rises to 3.3 V. On the other hand, the potential at power supply $V_{dd}$ has not yet risen to 2.5 V because power has not yet been applied to power supply $V_{dd}$ or even if power has already been applied, the potential at power supply $V_{dd}$ reaches 2.5 V later than the potential at $V_{dd}$ reaches 3.3 V.

In output device 104, the output signal applied to input terminal 141 of output buffer 140 is in an unstable state from the time when power supply $V_{DD}$ is applied until an initialization is performed. When the signal applied to input terminal 141 is a low logic level, PMOS transistor 143 is on.

Power supply $V_{DD}$ of output device 104 is also applied to the input terminal of delay circuit 146. Delay circuit 146 outputs a low logic level potential from its output terminal for a predetermined period after power supply $V_{DD}$ is applied to its input terminal. Since the low logic level potential is input to the gate terminal of NMOS transistor 144, NMOS transistor 144 does not turn on. Therefore, delay circuit 146 and NMOS transistor 144 prevent current from flowing from power supply $V_{DD}$ of output buffer 140 to output terminal 142. Thus, a current path does not form between power supply $V_{DD}$ of output device 104 and transmission line 300.

When the predetermined period, the delay time of delay circuit 146, has elapsed, delay circuit 146 outputs the high logic level potential of 3.3 V from the output terminal. Since a high logic level potential is applied to the gate terminal of NMOS transistor 144, NMOS transistor 144 turns from off to on. If PMOS transistor 143 is on, the current path is formed from power supply $V_{DD}$ of output buffer 140 to output terminal 142 through PMOS transistor 143 and NMOS transistor 144.

When the delay time of delay circuit 146 is set to a time between the time when power supply $V_{DD}$ is applied to output device 104 and the time when power supply $V_{dd}$ is applied to receive device 200, power supply $V_{dd}$ has already been applied to receive device 200 when the current from power supply $V_{DD}$ of output device 104 is transmitted to transmission line 300 through PMOS transistor 143 and NMOS transistor 144. The current may flow from power supply $V_{DD}$ of output device 104 to power supply $V_{dd}$ of receive device 200 through diode 220 only when the potential applied to the anode terminal of diode 220 exceeds the potential which is obtained by adding the potential of power supply $V_{dd}$ and the forward voltage of diode 220 because the potential of 2.5 V rises in power supply $V_{dd}$ in receive device 200.

Next, a sixth embodiment of the present invention will be described below in detail. A novel feature of the sixth embodiment is the configuration of the transistor provided between power supply $V_{DD}$ and PMOS transistor 143 of the output buffer. The other portions of the circuit are the same as those in the fifth embodiment.

Figure 6:
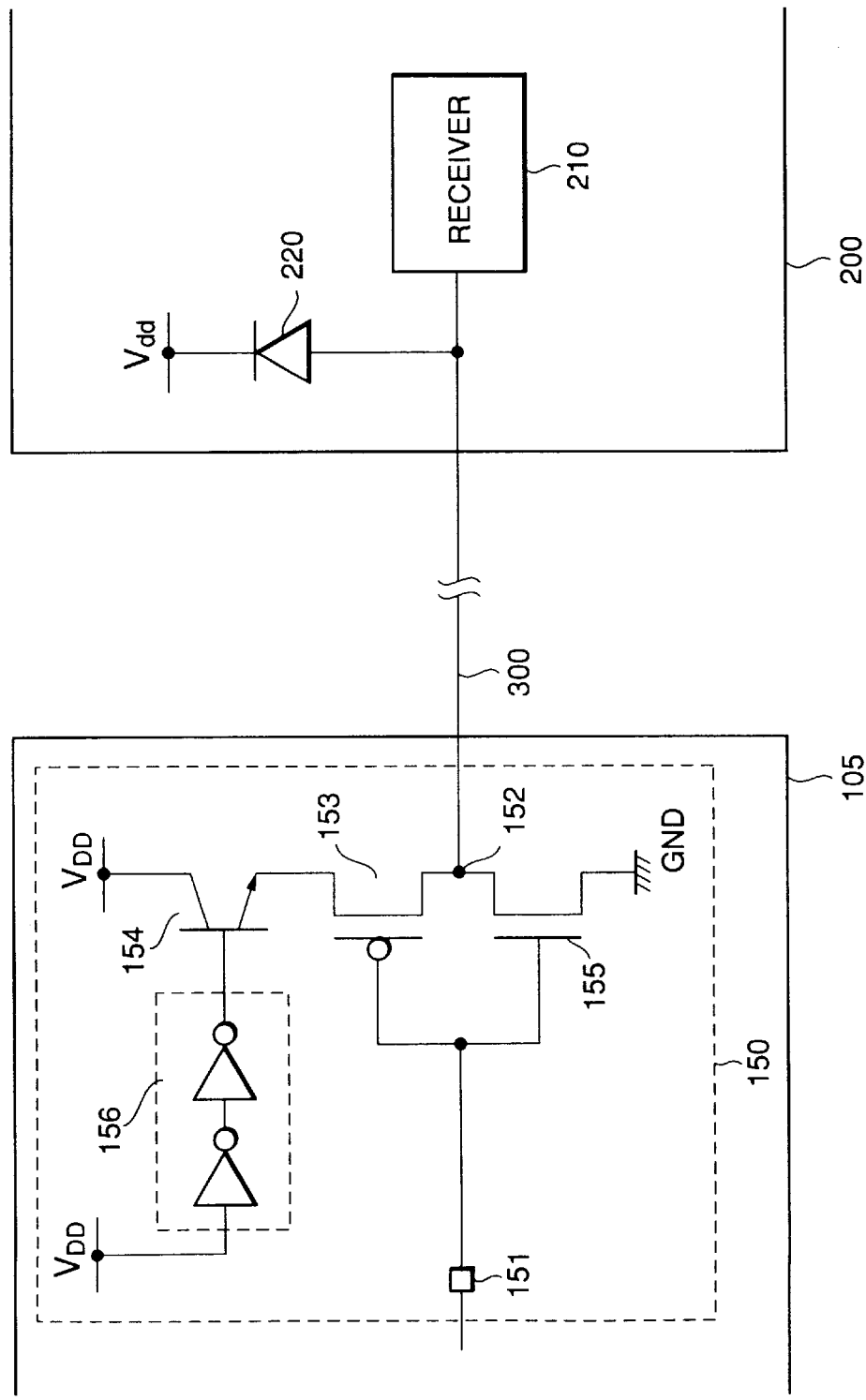
FIG. 6 is a circuit of the sixth embodiment of the present invention.

Referring to FIG. 6, an output device 105 includes an output buffer 150. Output buffer 150 has an input terminal 151 and an output terminal 152. A signal, which has a high or low logic level and is output to transmission line 300, is applied to input terminal 151. Output terminal 152 of output buffer 150 is connected to transmission line 300. Output buffer 150 includes a PMOS transistor 153, an NPN transistor 154, an NMOS transistor 155, and a delay circuit 156. Each of PMOS transistor 153, NMOS transistor 155, and delay circuit 156 has the same configuration as PMOS transistor 143, NMOS transistor 145, and delay circuit 146 in the fifth embodiment, respectively.

NPN transistor 154 has a base terminal. The base terminal is connected to the output terminal of delay circuit 156. NPN transistor 154 is connected between PMOS transistor 153 and power supply $V_{DD}$. NPN transistor 154 forms a current path between PMOS transistor 153 and power supply $V_{DD}$ based on the signal input to the gate terminal.

In this embodiment, output device 1035 is produced by a BiCMOS process.

Next, a seventh embodiment of the present invention will be described below in detail. A novel feature of the seventh embodiment is the internal configurations of the delay circuits 420, 126, 136, 146, and 156 of the first through the sixth embodiments. The other portions of the circuit are the same as those in the first through the sixth embodiments.

Figure 7:
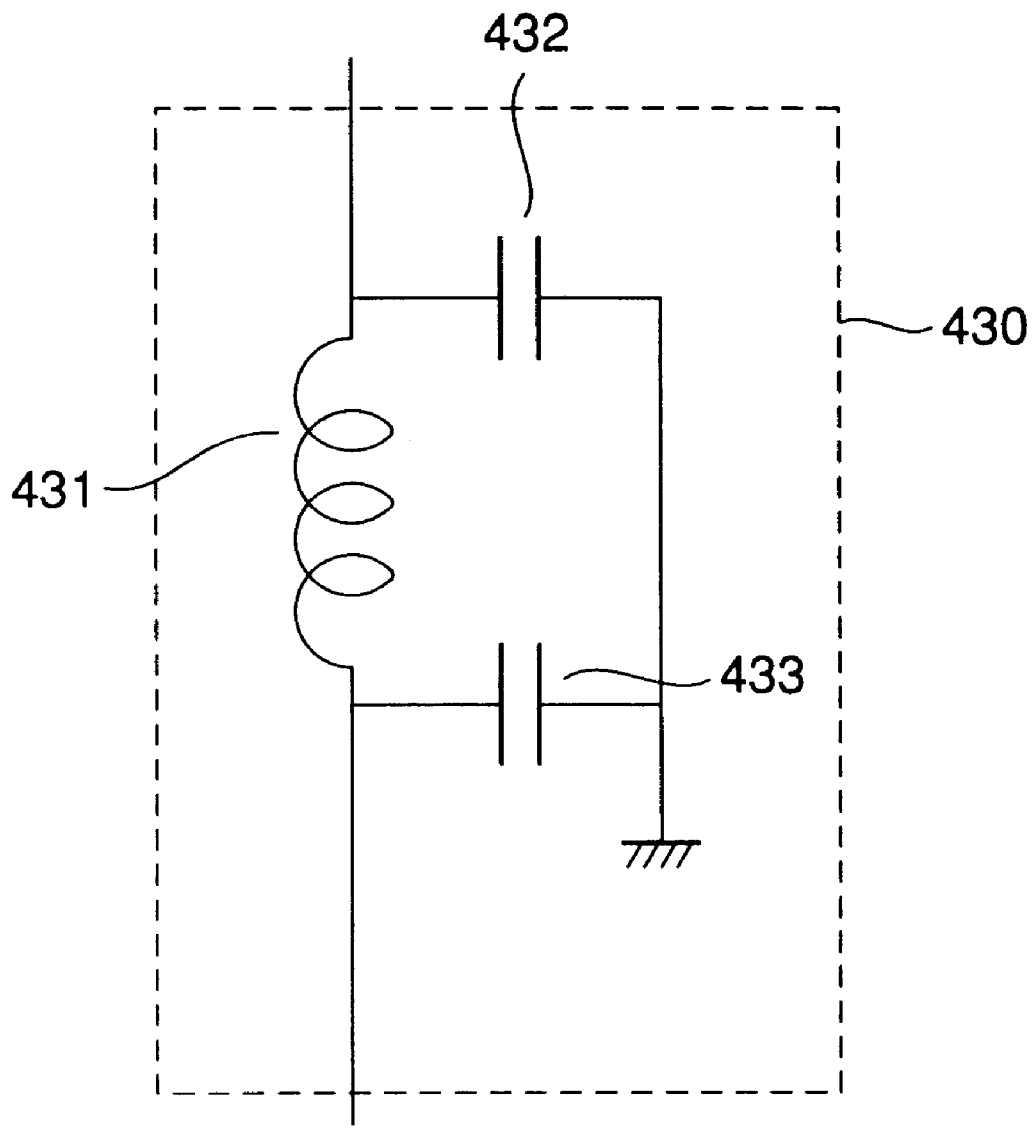
FIG. 7 is another delay circuit of the present invention.
Figure 8:
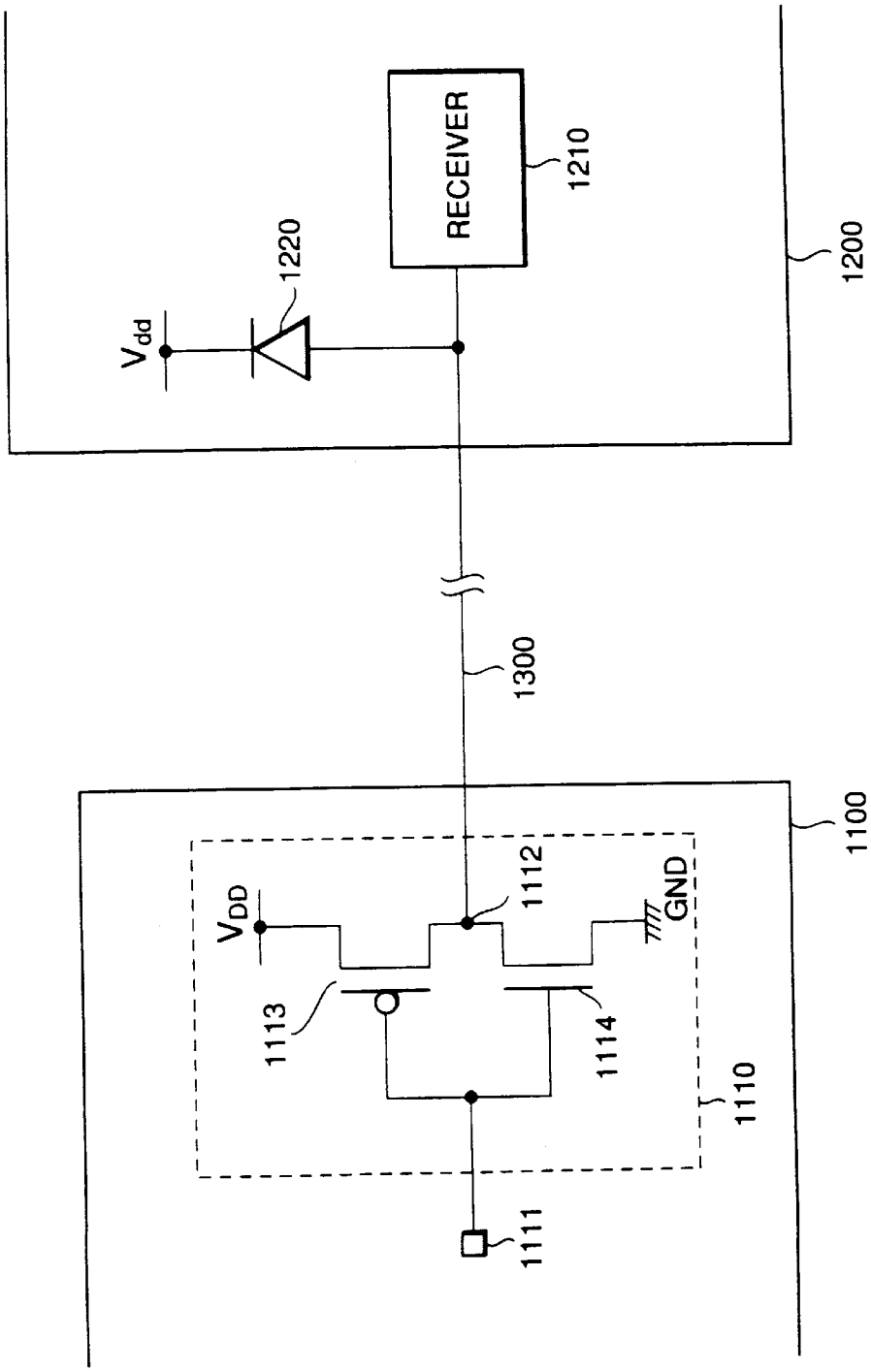
FIG. 8 is a conventional bus circuit.

Referring to FIG. 7, a delay circuit 430 includes an inductive element 431 and capacitors 432 and 433. Both ends of inductive element 431 are input and output terminals of the delay circuit. One end of capacitor 432 is connected to an input terminal of delay circuit 430, and the other end is connected to ground terminal GND. One end of capacitor 433 is connected to an output terminal of delay circuit 430, and the other to ground terminal GND.

In the first through sixth embodiment, the potentials of power supply $V_{DD}$ of the output device and power supply $V_{dd}$ of the receiving device are 3.3 V and 2.5 V, respectively. However, the potential of the output device and receive device are not limited to these values, but can be set to various potential values.

In first, second, fifth and sixth embodiment, the CMOS inverter is disclosed as an example of the buffer circuit 110, but it is not limited to this. Any buffer circuit containing at least a pull-up circuit can be applied.

In the first, third, and fifth embodiments, a cutoff circuit includes a delay circuit having two stages of inverters and an NMOS transistor. However, the configuration of the cutoff circuit is not limited to this. For example, a delay circuit containing one inverter stage and a PMOS transistor can form a cutoff circuit.

In the second, fourth, and sixth embodiments, a cutoff circuit includes a delay circuit having two inverter stages and an NPN transistor. However, the configuration of the cutoff circuit is not limited to this. For example, a delay circuit containing one inverter stage and a PNP transistor can form a cutoff circuit.

While this invention has been described in conjunction with the preferred embodiments described above, it will now be possible for those skilled in the art to put this invention into practice in various other manners.

What is claimed is:

1. A bus circuit comprising:
   a first circuit connected to a first power supply;
   a second circuit connected to a second power supply;
   a transmission line which connects said first and second circuits; and
   a third circuit which prevents current from flowing between said first and second power supplies through said transmission line for a predetermined period after said first power supply is applied to said first circuit.

2. The bus circuit as claimed in claim 1, wherein said third circuit prevents said current from flowing between said first and second power supplies until a potential of said second power supply rises to a predetermined potential.

3. The bus circuit as claimed in claim 1, wherein said third circuit comprises:
   a fourth circuit which is provided in a path from said first power supply to said second power supply and which opens and closes said path; and
   a fifth circuit which make said fourth circuit close for said predetermined period after said first power supply is applied to said first circuit.

4. The bus circuit as claimed in claim 3, wherein said fifth circuit outputs a control signal which makes said fourth circuit open after said predetermined period has elapsed; and
   wherein said fourth circuit closes said path until said fourth circuit receives said control signal from said fifth circuit.

5. The bus circuit as claimed in claim 4, wherein said fifth circuit comprises a sixth circuit which inputs a potential of said first power supply, and outputs said potential after said predetermined period has elapsed; and
   wherein said fourth circuit comprises a transistor which inputs the output from said fourth circuit and is connected to form a current path between said first power supply and said second power supply based on said output.

6. The bus circuit as claimed in claim 5, wherein said sixth circuit includes an inductive element and first and second capacitive elements,
   wherein said inductive element has an input terminal which inputs said potential of said first power supply and an output terminal,
   wherein said first capacitive element is connected between the input terminal of said inductive element and ground terminal, and
   wherein said second capacitive element is connected between the output terminal of said inductive element and the ground terminal.

7. A bus circuit comprising:
   a transmission line;
   a first circuit which is connected to a first power supply and outputs a signal to said transmission line;
   a second circuit which is connected to a second power supply and receives said signal output by said first circuit through said transmission line; and
   a third circuit which is provided between said transmission line and said first circuit and which prevents said signal from transmitting from said first circuit to said transmission line for a predetermined period after said first power supply is applied to said first circuit.

8. The bus circuit as claimed in claim 7, wherein said third circuit comprises:
   a fourth circuit comprising an input terminal connected to said first power supply, and an output terminal which outputs a potential applied to said input terminal after said predetermined period has elapsed; and a fifth circuit which forms a current path between said first circuit and said transmission line based on the output from said fourth circuit.

9. The bus circuit as claimed in claim 8, wherein said fifth circuit comprises a transistor which has a control terminal inputting said output from said fourth circuit and which is connected to form a current path between said first power supply and said transmission line based on said output.

10. The bus circuit as claimed in claim 7, wherein said predetermined period is a time between when said first power supply is applied and a time when said second power supply is applied to said second circuit.

11. The bus circuit as claimed in claim 7, wherein said predetermined period is a value obtained by subtracting a signal propagation time from said first power supply to said second power supply from a time between when said first power supply is applied to said first circuit and a time when said second power supply is applied to said second circuit.

12. The bus circuit as claimed in claim 7, wherein said second circuit further comprises a diode which has one end connected to said transmission line and the other end connected to said second power supply and forms a current path from said transmission line to said second power supply.

13. A bus circuit comprising:

a transmission line;

a first circuit comprising an output terminal connected to said transmission line and a path which is formed between a first power supply and said output terminal and is used for outputting a high logic level logic signal to said transmission line; and a second circuit connected to a second power supply and connected to said output terminal of said first circuit through said transmission line, wherein said first circuit prevents current from flowing on said path between said first power supply and said second power supply for a predetermined period after said first power supply is applied to said first circuit.

14. The bus circuit as claimed in claim 13, wherein said first circuit further comprises:

a third circuit comprising an input terminal connected to said first power supply, and an output terminal which outputs a potential applied to said input terminal after said predetermined period has elapsed; and a fourth circuit which is connected between said first power supply and said output terminal and prevents current from flowing on said path based on the output from said third circuit.

15. The bus circuit as claimed in claim 14, wherein said fourth circuit comprises a transistor which has a control terminal inputting said output from said third circuit and which is connected to form a current path between said first power supply and said transmission line based on said output.

16. The bus circuit as claimed in claim 13, wherein said predetermined period is a time between when said first power supply is applied to said first circuit and a time when said second power supply is applied to said second circuit.

17. The bus circuit as claimed in claim 13, wherein said predetermined period is a value obtained by subtracting a signal propagation time from said first power supply to said second power supply from a time period from a time between when said first power supply is applied to said first circuit and a time when said second power supply is applied to said second circuit.

18. The bus circuit as claimed in claim 13, wherein said second circuit further comprises a diode which has one end connected to said transmission line and the other end connected to said second power supply and forms a current path from said transmission line to said second power supply.

* * * * *